United States Patent
Hitomi et al.

(10) Patent No.: US 11,811,371 B2
(45) Date of Patent: Nov. 7, 2023

(54) RADIO-FREQUENCY CIRCUIT AND COMMUNICATION DEVICE

(71) Applicant: MURATA MANUFACTURING CO., LTD., Kyoto (JP)

(72) Inventors: Shinya Hitomi, Nagaokakyo (JP); Hidenori Obiya, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 104 days.

(21) Appl. No.: 16/908,835

(22) Filed: Jun. 23, 2020

(65) Prior Publication Data
US 2020/0412307 A1   Dec. 31, 2020

(30) Foreign Application Priority Data
Jun. 28, 2019  (JP) ................................. 2019-121735

(51) Int. Cl.
*H03F 1/02* (2006.01)
*H03F 3/21* (2006.01)
*H03F 3/19* (2006.01)
*H03F 3/24* (2006.01)

(52) U.S. Cl.
CPC .......... *H03F 3/245* (2013.01); *H03F 1/0233* (2013.01); *H03F 3/19* (2013.01); *H03F 3/211* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 9,431,967 B2 | 8/2016 | Winiecki et al. | |
| 9,461,590 B2* | 10/2016 | Langer | H03F 1/0222 |
| 10,404,166 B2 | 9/2019 | Khesbak et al. | |
| 10,476,437 B2 | 11/2019 | Nag et al. | |
| 2014/0111178 A1 | 4/2014 | Khlat et al. | |
| 2016/0094192 A1* | 3/2016 | Khesbak | H03F 3/24 |
| | | | 455/73 |
| 2017/0005619 A1* | 1/2017 | Khlat | H03F 3/245 |
| 2017/0006544 A1* | 1/2017 | Khlat | H03F 1/02 |
| 2019/0052238 A1* | 2/2019 | Yan | H03F 1/0211 |
| 2019/0190563 A1* | 6/2019 | Sakurai | H04B 1/0057 |
| 2019/0253023 A1* | 8/2019 | Yang | H03F 3/245 |

FOREIGN PATENT DOCUMENTS

JP  2018-182720 A  11/2018

OTHER PUBLICATIONS

Sprint, R-IM3 Sensitivity to LET and NR Powers in B41/n41 EN-DC, 3GPP TSG-RAN WG4 Meeting 90, Feb. 25-Mar. 1, 2019, pp. 1-10, R4-1901930, Sprint, Athens, Greece.

* cited by examiner

*Primary Examiner* — Pablo N Tran
(74) *Attorney, Agent, or Firm* — Pearne & Gordon LLP

(57) ABSTRACT

A radio-frequency circuit includes a power amplifying circuit configured to amplify a first radio-frequency signal having a first channel bandwidth and a second radio-frequency signal having a second channel bandwidth greater than the first channel bandwidth. The power amplifying circuit is configured to amplify the first radio-frequency signal in an amplifying mode according to an average power tracking method, and to amplify the second radio-frequency signal in an amplifying mode according to an envelope tracking method.

19 Claims, 6 Drawing Sheets

APT mode

ET mode

RADIO-FREQUENCY CIRCUIT AND COMMUNICATION DEVICE

CROSS REFERENCE TO RELATED APPLICATION

The present application is based on and claims priority of Japanese Patent Application No. 2019-121735 filed on Jun. 28, 2019. The entire disclosure of the above-identified application, including the specification, drawings and claims is incorporated herein by reference in its entirety.

TECHNICAL FIELD

The present disclosure relates to a radio-frequency circuit and a communication device including the radio-frequency circuit.

BACKGROUND

Radio-frequency circuits that support multiband and multimode communication should transmit, with high quality, a plurality of radio-frequency signals having different communication band bandwidths and channel bandwidths.

Patent Literature (PTL) 1 discloses a circuit configuration of a power amplification module capable of switching between operation according to an envelope tracking method and operation according to an average power tracking method, according to the output power of a power amplifier. According to this paper, a small and low-cost amplifier module can be provided.

PTL 1: Japanese Unexamined Patent Application Publication No. 2018-182720

BRIEF SUMMARY

However, in the power amplifier module (a radio-frequency circuit) disclosed in PTL 1, there is the issue that power consumption of a power amplifying circuit becomes high when radio-frequency signals of a communication band having a wide bandwidth or radio-frequency signals having a wide channel bandwidth are amplified according to the average power tracking method.

In view of the above, the present disclosure provides a radio-frequency circuit and a communication device that reduce power consumption of a power amplifying circuit.

A radio-frequency circuit according to an aspect of the present disclosure includes a power amplifying circuit configured to amplify a first radio-frequency signal having a first channel bandwidth and a second radio-frequency signal having a second channel bandwidth greater than the first channel bandwidth, wherein the power amplifying circuit is configured to amplify the first radio-frequency signal in an amplifying mode according to an average power tracking method, and amplify the second radio-frequency signal in an amplifying mode according to an envelope tracking method.

The present disclosure can provide a radio-frequency circuit and a communication device that reduce power consumption of a power amplifying circuit.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION

Figure 1:
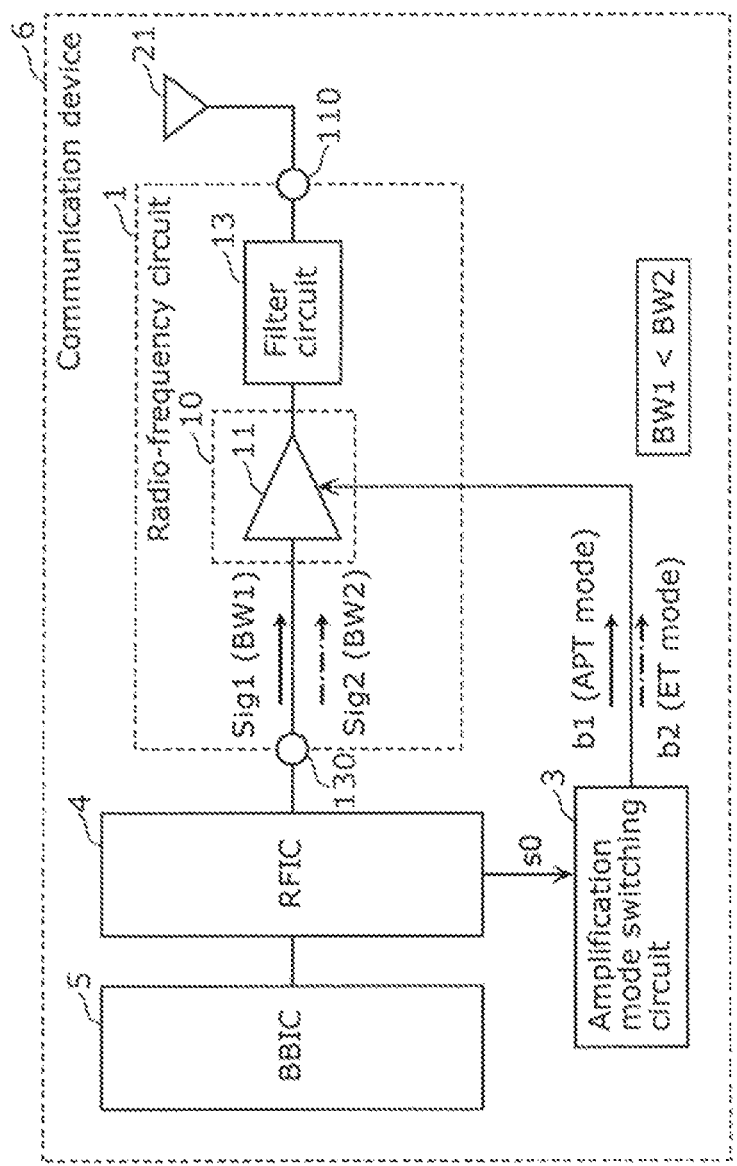
FIG. 1 is a circuit configuration diagram of a radio-frequency circuit and a communication device according to an embodiment.

Hereinafter, exemplary embodiments of the present disclosure will be described in detail with reference to the drawings. It should be noted that each of the subsequently described exemplary embodiments shows a generic or a specific example. The numerical values, shapes, materials, elements, the arrangement and connection of the elements, and others indicated in the following exemplary embodiments are mere examples, and therefore are not intended to limit the present disclosure. Among the elements described in the following exemplary embodiments, elements not recited in any one of the independent claims are described as optional elements. In addition, the sizes of the elements and the ratio of the sizes illustrated in the drawings are not necessarily accurate.

EMBODIMENTS AND VARIATIONS

1. Configuration of Radio-Frequency Circuit 1 and Communication Device 6 (First Application Example)

FIG. 1 is a circuit configuration diagram of radio-frequency circuit 1 and communication device 6 according to the embodiment. As illustrated in the figure, communication device 6 includes radio-frequency circuit 1, antenna element 21, amplification mode switching circuit 3, RF signal processing circuit (RFIC) 4, and baseband signal processing circuit (BBIC) 5.

Radio-frequency circuit 1 includes input terminal 130, output terminal 110, power amplifying circuit 10, and filter circuit 13.

Power amplifying circuit 10 includes power amplifier 11. Specifically, power amplifying circuit 10 includes a single power amplifier 11. It should be noted that power amplifying circuit 10 may include two or more power amplifiers, or may include a circuit element other than a power amplifier. Power amplifier 11 is connected between input terminal 130 and filter circuit 13.

As a first application example of radio-frequency 1 according to this embodiment, power amplifying circuit 10 amplifies radio-frequency signal Sig1 (a first radio-frequency signal) having channel bandwidth BW1 (a first channel bandwidth) and radio-frequency signal Sig2 (a second radio-frequency signal) having channel bandwidth BW2 (a second channel bandwidth) which is wider than channel bandwidth BW1.

Power amplifier 11 includes, for example, bipolar amplifier transistors having a base terminal, an emitter terminal, and a collector terminal. It should be noted that the amplifier transistors included in power amplifier 11 are not limited to a bipolar transistor, and may be a metal-oxide-semiconductor field-effect-transistor (MOSFET), for example.

A bias signal (a direct current bias voltage or a direct current bias current) is supplied to the base terminal and a direct current power supply voltage is supplied to the collector terminal of each of the amplifier transistors included in power amplifier 11. Changing (the voltage or current of) the bias signals supplied to the base terminal of each of the amplifier transistors optimizes the operating point of the respective amplifier transistors.

Filter circuit 13, which is an example of a first filter, is connected between power amplifier 110 and output terminal 110, and allows the radio-frequency signal amplified by power amplifier 11 to pass with low loss. It should be noted that filter circuit 13, input terminal 130, and output terminal 110 are not necessarily essential elements of radio-frequency circuit 1 according to this embodiment.

Here, in the first application example of radio-frequency circuit 1 according to this embodiment, power amplifying circuit 10 amplifies radio-frequency signal Sig1 according to the average power tracking (APT) method and amplifies radio-frequency signal Sig2 according to the envelope tracking (ET) method.

Figure 2A:
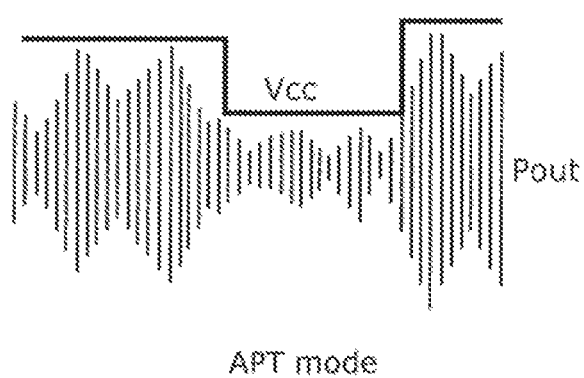
FIGS. 2A and 2B illustrate schematic waveform diagrams for describing an average power tracking mode and an envelope tracking mode, respectively.
Figure 2B:
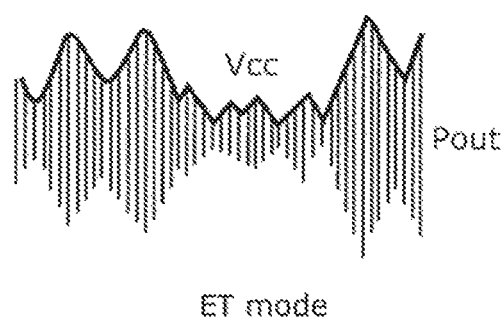

FIGS. 2A and 2B illustrate schematic waveform diagrams for describing the APT mode and the ET mode. As illustrated in FIG. 2B, the ET mode (i.e., an amplification mode according to the ET method) is a mode that tracks the power amplitude (an envelope) of the radio-frequency signal, and varies the bias signal (a direct current bias voltage or direct current bias current) to be supplied to (the base terminals of) the amplifier transistors of) the power amplifier according to the envelope. In contrast, as illustrated in FIG. 2A, the APT mode (i.e., an amplification mode according to the APT method) is a mode that follows the average power amplitude of a radio-frequency signal calculated on a predetermined period basis, and varies the bias signal (a direct current bias voltage or direct current bias current) to be supplied to (the base terminals of the amplifier transistors of) the power amplifier according to the average power amplitude.

Figure 3A:
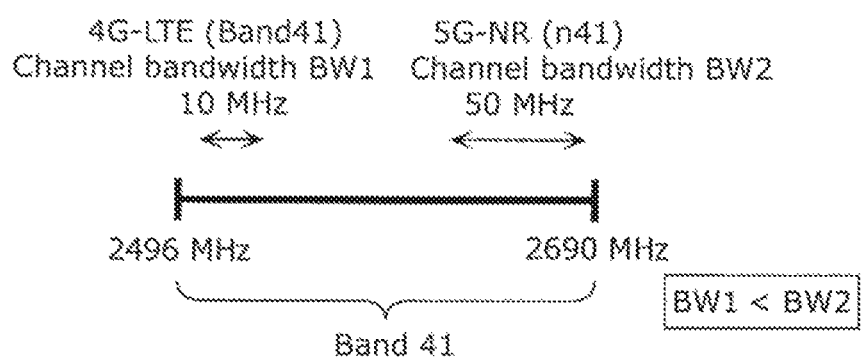
FIG. 3A is a diagram illustrating an example of the distribution of a 4G-LTE channel and a 5G-NR channel which have different channel bandwidths.

FIG. 3A is a diagram illustrating an example of the distribution of a fourth generation mobile communication system (4G)-long term evolution (LTE) channel and a fifth generation mobile communication system (5G)-new radio (NR) channel which have different channel bandwidths. In the figure, Band 41 (the band: 2496 MHz to 2690 MHz) of 4G-LTE and n41 (the band: 2496 MHz to 2690 MHz) of 5G-NR which have the same frequency bands are written together.

As illustrated in FIG. 3A, for example, a signal having a channel bandwidth as Band 41 is a radio-frequency signal used in 4G and has a channel bandwidth of 5 MHz, 10 MHz, 15 MHz, or 20 MHz. Furthermore, for example, a signal having a channel bandwidth as n41 is a radio-frequency signal used in 5G and has a channel bandwidth of 10 MHz, 15 MHz, 20 MHz, 30 MHz, 40 MHz, 50 MHz, 60 MHz, 70 MHz, 80 MHz, 90 MHz, or 100 MHz.

In the first application example of radio-frequency circuit 1 according to this embodiment in FIG. 1, for example, the channel allocation illustrated in FIG. 3A is applied. For example, a signal having channel bandwidth BW1 (10 MHZ) of 4G-LTE (Band 41) is applied as radio-frequency signal Sig1, and a signal having channel bandwidth BW2 (50 MHz) of 5G-NR (n41) is applied as radio-frequency signal Sig2. In this case, channel bandwidth BW2 of 5G-NR (n41) is wider than channel bandwidth BW1 of 4G-LTE (Band 41).

It should be noted that radio-frequency signals Sig1 and Sig2 are not limited to the above-described channel allocation.

Table 1 indicates examples of channel bandwidths and band bandwidths (i.e., communication band bandwidths) of 4G-LTE communication bands and 5G-NR communication bands.

TABLE 1

| Radio-frequency signal Sig1 | | | | | | | |
|---|---|---|---|---|---|---|---|
| LTE (B41) (2496-2690 MHz) | | LTE (B25-Tx) (1850-1915 MHz) | | LTE (B5-Tx) (824-849 MHz) | | NR (n5-Tx) (824-849 MHz) | |
| Band Bandwidth | Channel bandwidth | Band Bandwidth | Channel bandwidth | Band Bandwidth | Channel bandwidth | Band Bandwidth | Channel bandwidth |
| 194 MHz | 10 MHz | 65 MHz | 10 MHz | 25 MHz | 10 MHz | 25 MHz | 10 MHz |
| Radio-frequency signal Sig2 | | | | | | | |
| NR (n41) (2496-2690 MHz) | | NR (n41) (2496-2690 MHz) | | NR (n78) (3300-3800 MHz) | | LTE (B3-Tx) (1805-1880 MHz) | |
| Band Bandwidth | Channel bandwidth | Band Bandwidth | Channel bandwidth | Band Bandwidth | Channel bandwidth | Band Bandwidth | Channel bandwidth |
| 194 MHz | 50 MHz | 194 MHz | 50 MHz | 500 MHz | 50 MHz | 75 MHz | 20 MHz |

It should be noted that aside from the combinations given in Table 1, the combinations of radio-frequency signal Sig1 and radio-frequency signal Sig2 maybe the combinations described below.

Radio-frequency signal Sig1 is a signal of any one of the following 4G-LTE bands: Band 28 (the transmission band: 703 MHz to 748 MHz); Band 20 (the transmission band: 832 MHz to 862 MHz); Band 26 (the transmission band: 814 MHz to 849 MHz); Band 8 (the transmission band: 880 MHz to 915 MHz); Band 3 (the transmission band: 1710 MHz to 1785 MHz); Band 66 (the transmission band: 1710 MHz to 1780 MHz); Band 39 (the transmission band: 1880 MHz to 1920 MHz); Band 2 (the transmission band: 1850 MHz to 1910 MHz); Band 1 (the transmission band: 1920 MHz to 1980 MHz); and Band 40 (the transmission band: 2300 MHz to 2400 MHz). Furthermore, radio-frequency signal Sig2 is a signal of any of the following 5G-NR bands: n41 (the band: 2496 MHz to 2690 MHz); n77 (the band: 3300 MHz to 4200 MHz); n78 (the band: 3300 MHz to 3800 MHz); and n79 (the band: 4400 MHz to 5000 MHz); In these combinations, radio-frequency signal Sig2 has a wider bandwidth than radio-frequency signal Sig1.

In the first application example of radio-frequency circuit 1 according to this embodiment in FIG. 1, for example, the channel allocation indicated in Table 1 may be applied. For example, a signal having channel bandwidth BW1 (10 MHZ) of 4G-LTE (Band 25-Tx) is applied as radio-frequency signal Sig1, and a signal having channel bandwidth BW2 (50 MHz) of 5G-NR (n41) is applied as radio-frequency signal Sig2. Furthermore, for example, a signal having channel bandwidth BW1 (10 MHZ) of 4G-LTE (Band 5-Tx) is applied as radio-frequency signal Sig1, and a signal having channel bandwidth BW2 (50 MHz) of 5G-NR (n78) is applied as radio-frequency signal Sig2. Furthermore, for example, a signal having channel bandwidth BW1 (10 MHZ) of 5G-NR (Band n5-Tx) is applied as radio-frequency signal Sig1, and a signal having channel bandwidth BW2 (20 MHz) of 4G-LTE (B3-Tx) is applied as radio-frequency signal Sig2.

It should be noted that a signal of a wireless local area network (WLAN) of IEEE802.11 may be applied as radio-frequency signal Sig1 or radio-frequency signal Sig2, and, for example, Wi-Fi 2.4 GHz band, Wi-Fi (5.15 GHz to 7.125 GHz), or WiGig is applied, for example. Moreover, the modulated signal of WLAN is the same as that of 5G-NR.

Specifically, radio-frequency signal Sig1 may be a signal used in 4G and radio-frequency signal Sig2 may be a signal of WLAN. Furthermore, in this case, the peak-to-average power ratio (PAPR) of radio-frequency signal Sig2 may be larger than the PAPR of radio-frequency signal Sig1. When radio-frequency signal Sig1 is a signal used in 4G and radio-frequency signal Sig2 is a signal of WLAN, radio-frequency signal Sig1 is a signal of a communication band given in Table 1 or a signal of any one of Band 28, 20, 26, 8, 3, 66, 39, 2, 1, or 40 (bands: 2300 MHz to 2400 MHz).

Furthermore, radio-frequency signal Sig1 may be a signal of WLAN, and radio-frequency signal Sig2 may be a signal used in 5G. When radio-frequency signal Sig1 is a signal of WLAN and radio-frequency signal Sig2 is a signal used in 5G, the signal of WLAN is a signal within the 5.15 GHz to 7.125 GHz band, and the signal used in 5G is a signal within the 5.15 GHz to 7.125 GHz band or a signal of any one of n41, n77, n78, and n79.

Furthermore, radio-frequency signal Sig1 and radio-frequency signal Sig2 may be signals of WLAN.

In a radio-frequency circuit that includes a power amplifier, the power consumption of the power amplifier occupies a large portion of the power consumption of the radio-frequency circuit, and thus, in order to reduce power consumption, improving the efficiency of the power amplifier is a challenge. The ET method is given as a technique of improving the efficiency of the power amplifier. In modulation methods such as orthogonal frequency division multiplexing (OFDM) used in wireless communication, the ratio of peak power to average power (i.e., peak-to-average power ratio (PAPR)) of an input signal of a power amplifier becomes large. In amplifying and transmitting such a modulated signal, for the input signal during peak power, a bias voltage is applied to the amplifier transistor so that the amplifier transistor operates in the compression region. In other words, because the bias voltage becomes excessive during average power, varying the bias voltage according to the input modulated signal of the power amplifier (ET mode) enables the power consumption of the power amplifier to be reduced. In the case of the ET mode, however, since the power amplifier is made to operate in the compression region, signal distortion is generated. In contrast, the APT mode, though inferior to the ET mode in terms of reducing power consumption, can reduce the generation of signal distortion compared to the ET mode.

On the other hand, as the frequency bandwidth of the radio-frequency signal to be amplified by the power amplifier becomes wider, the frequency for which the power amplifier has to perform amplification becomes a wider band, and thus the power consumption of the power amplifier becomes high. In particular, the wider the channel bandwidth of the radio-frequency signal to be amplified by the power amplifier is, the higher the power consumption of the power amplifier becomes.

Since the change in amplitude to be tracked according to the ET mode increases as the PAPR is larger, signal distortion increases. Since PAPR is the amplitude fluctuation when a composite signal of respective subcarriers that have undergone multi-value modulation is viewed over the temporal axis, the PAPR of the composite signal tends to be larger as the multi-value (the number of symbols) and number of carriers (the number of different frequencies) is greater. As one example, a diagram comparing the magnitude of the PAPRs of modulated signals defined in 3GPP TS 38.101-1 is provided.

Figure 3B:
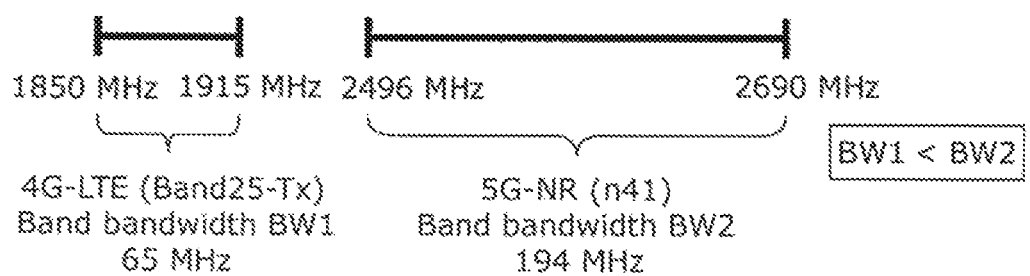
FIG. 3B is a diagram illustrating an example of the distribution of a 4G-LTE channel and a 5G-NR channel which have different band bandwidths.
Figure 3C:
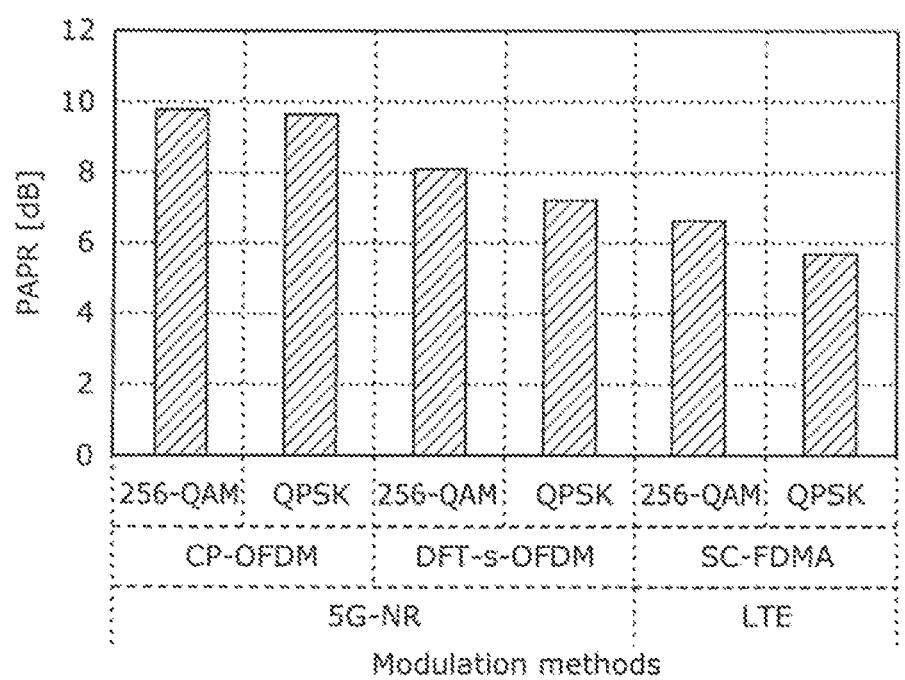
FIG. 3C is a graph illustrating a relationship between a primary modulation method and a secondary modulation method, and PAPR.

FIG. 3C is a graph illustrating a relationship between a primary modulation method and a secondary modulation method, and PAPR. In the figure, the horizontal axis denotes the modulation method and the vertical axis denotes the PAPR. Primary modulation methods include, for example, phase-shift keying (PSK), amplitude-shift keying (ASK), frequency-shift keying (FSK), or quadrature amplitude modulation: QAM), and the like. In FIG. 3C, quadrature phase-shift keying (QPSK) and 256-QAM are given as examples of primary modulation methods. PAPR has strong dependence on the secondary modulation method (SC-FDMA, DFT-s-OFDM, and CP-OFDM), and a PAPR increases in the order of SC-FDMA, DFT-s-OFDM, and CP-OFDM. In other words, the PAPR of a 5G-NR signal is larger than the PAPR of an LTE signal. Accordingly, a 5G-NR signal is more prone to amplifier output waveform distortion than an LTE signal.

It should be noted that single-carrier frequency-division multiplexing (SC-FDM) is to be used for a secondary modulation method (uplink) of the LTE signal. Moreover, there are also cases where the term SC-FDM means single-carrier frequency-division multiple access (SC-FDMA) which is multiple connection in which SC-FDM is applied. In the present disclosure, SC-FDMA is used in place of SC-FDM.

Furthermore, discrete Fourier transform spread orthogonal frequency-division multiplexing (DFT-s-OFDM) or cyclic prefix orthogonal frequency-division multiplexing (CP-OFDM) is used for the secondary modulation method of the 5G-NR signal. A WLAN signal is a signal that is transmitted according to the Institute of Electrical and Electronic Engineers (IEEE) 802.11 standard. Orthogonal frequency-division multiplexing (OFDM) is used for the secondary modulation method of the WLAN signal. It should be noted that there are also cases where DFT-s-OFDM, CP-OFDM, and OFDM may mean orthogonal frequency division multiple access (OFDMA) which is multiple connection in which each of DFT-s-OFDM, CP-OFDM, and OFDM is applied.

In view of the above, according to the first application example of this embodiment, radio-frequency signal Sig1 having relatively narrow channel bandwidth BW1 is amplified in the APT mode and radio-frequency signal Sig2 having a relatively wide channel bandwidth BW2 is amplified in the ET mode. According to this configuration, the APT mode reduces signal distortion in the amplification of radio-frequency signal Sig1 of 4G-LTE (e.g., Band 41) for which power consumption is low and the ET mode enables the reduction of power consumption in the amplification of radio-frequency signal Sig2 of 5G-NR (e.g., n41) for which power consumption is high. Therefore, radio-frequency circuit 1 and communication device 6 that reduce the power consumption of power amplifying circuit 10 can be provided.

It should be noted that when the 5G-NR signal is a modulated signal having a larger PAPR than the 4G-LTE signal, the distortion reduction effect increases. The modulation method of the modulated signal is 256-QAM or CP-OFDM, for example.

It should be noted that when the WLAN signal is a modulated signal having a larger PAPR than the 4G-LTE signal or the 5G-NR, the distortion reduction effect increases. The modulated signal is of 256-QAM or CP-OFDM, for example.

It should be noted that in radio-frequency circuit 1 according to this embodiment in FIG. 1, power amplifier 11 amplifies radio-frequency signal Sig1 and radio-frequency signal Sig2 by time division. According to this configuration, the power consumption when amplifying radio-frequency signal Sig2 which has a wide channel bandwidth can be reduced while amplifying two radio-frequency signals having different channel bandwidths by time division. It should be noted that, when power amplifying circuit 10 includes two or more power amplifiers, radio-frequency signal Sig1 and radio-frequency signal Sig2 may be simultaneously amplified by the two or more power amplifiers, and the two radio-frequency signals that have been amplified may be simultaneously transmitted from radio-frequency circuit 1. The configuration for this simultaneous amplification and simultaneous transmission will be described in detail in Variations 1 and 2 of the embodiment in FIG. 1.

Hereinafter, elements included in communication device 6 other than radio-frequency circuit 1 will be described.

Antenna element 21 is connected to output terminal 110 of radio-frequency circuit 1, transmits the radio-frequency signal amplified by power amplifying circuit 10, and receives radio-frequency signals transmitted from another communication device (base station, and the like).

RFIC 4 is an RF signal processing circuit that processes radio-frequency signals. Specifically, RFIC 4 performs, by upconversion, etc., signal processing on transmission signals input from BBIC 5, and outputs the radio-frequency transmission signals generated by the signal processing to radio-frequency circuit 1. Furthermore, RFIC 4 includes a controller (e.g., a processor) that outputs a control signal for controlling whether power amplifying circuit 10 operates in the ET mode or the APT mode, based on information on which of radio-frequency signal Sig1 or Sig2 is to be output to radio-frequency circuit 1.

BBIC 5 is a circuit that performs signal processing using an intermediate frequency band having a lower frequency than a radio-frequency signals propagating in radio-frequency circuit 1. The signal processed by BBIC 5 is, for example, used as image signals for image display or as a sound signal for conversation via a speaker.

RFIC 4 and BBIC 5 are signal processing circuits that process radio-frequency signals.

Amplification mode switching circuit 3 is disposed between the controller of RFIC 4 and power amplifying circuit 10. Amplification mode switching circuit 3 switches between supplying bias signal b1 (a first bias signal) corresponding to the APT mode and supplying bias signal b2 (a second bias signal) corresponding to the ET mode, to power amplifier 11, based on control signal s0 output from the controller of RFIC 4.

According to the above-described configuration of communication device 6, output power information of power amplifier 11 is received by RFIC 4, and the controller of RFIC 4 determines the amplification mode based on the output power information. The controller outputs control signal s0 corresponding to the determined amplification mode to amplification mode switching circuit 3. Amplification mode switching circuit 3 switches the supplying bias signals (b1 or b2) for the APT mode or the ET mode to radio-frequency circuit 1, based on aforementioned control signal s0. Therefore, power consumption can be reduced using the simplified circuit configuration of communication device 6.

It should be noted that in communication device 6 according to this embodiment in FIG. 1, antenna element 21 and BBIC 5 are not necessarily essential elements.

Furthermore, the controller that outputs the control signals for controlling whether power amplifier 11 is to operate in the ET mode or the APT mode need not to be included in RFIC 4, and may be included in BBIC 5, or may be included in another element of communication device 6 other than RFIC 4 and BBIC 5.

Furthermore, in radio-frequency circuit 1 and communication device 6 according to this embodiment, when a value indicating the output power of the radio-frequency signal output from power amplifying circuit 10 is greater than a threshold power, radio-frequency signal Sig1 may be amplified in an amplification mode according to the APT method and radio-frequency signal Sig2 may be amplified in an amplification mode according to the ET method.

According to this configuration, in the high output region in which the power consumption of power amplifying circuit 10 outputting the radio-frequency signal becomes high, radio-frequency signal Sig2 which has a wider channel bandwidth than radio-frequency signal Sig1 is amplified in the ET mode, and thus the power consumption of power amplifying circuit 10 can be effectively reduced. It should be noted that, the permitted value of the radio-frequency component of the radio-frequency signal that is output from power amplifier 11 or the permitted value of the intermodulation distortion generated by the radio-frequency signal that is output from power amplifier 11 and the radio-frequency signal that is output from another power amplifier are given as examples of the threshold power. Moreover, when the value indicating the output power of the radio-frequency signal output from power amplifying circuit 10 is less than or equal to the threshold power, power amplifying circuit 10 may, for example, amplify both radio-frequency signals Sig1 and Sig2 in the amplification mode according to the APT method.

It should be noted that although one of radio-frequency signals Sig1 and Sig2 is a signal used in 4G and the other of radio-frequency signals Sig1 and Sig2 is a signal used in 5G in radio-frequency circuit 1 according to this embodiment, they are not limited to such signals. In radio-frequency circuit 1 according to this embodiment, radio-frequency signal Sig1 may be a signal used in 4G and radio-frequency signal Sig2 may also be a signal used in 4G.

According to this configuration, the APT mode reduces signal distortion in the amplification of radio-frequency signal Sig1 of 4G-LTE which has a wide channel bandwidth, and the ET mode enables the reduction of power consumption in the amplification of radio-frequency signal Sig2 of 4G-LTE which has a wide channel bandwidth. Therefore, in radio-frequency circuit 1 and communication device 6 that transfer 4G-LTE radio-frequency signals, power consumption can be reduced.

Furthermore, in radio-frequency circuit 1 according to this embodiment, radio-frequency signal Sig1 may be a signal used in 5G and radio-frequency signal Sig2 may also be a signal used in 5G.

According to this configuration, the APT mode reduces signal distortion in the amplification of radio-frequency signal Sig1 of 5G-NR which has a narrow channel bandwidth, and the ET mode enables the reduction of power consumption in the amplification of radio-frequency signal Sig2 of 5G-NR which has a narrow channel bandwidth. Therefore, in radio-frequency circuit 1 and communication device 6 that transfer 5G-NR radio-frequency signals, power consumption can be reduced.

It should be noted that, in communication device 6 according to this embodiment in FIG. 1, the antenna that transmits and receives radio-frequency signal Sig1 and the antenna that transmits and receives radio-frequency signal Sig2 may be different. In other words, communication device 6 may include a first antenna element and a second antenna element in place of antenna element 21. In this case, for example, a single-pole double-throw (SPDT) switch is disposed between filter circuit 13 and the first and second antenna elements. The common terminal of the switch is connected to filter circuit 13, the first selection terminal of the switch is connected to the first antenna element, and the second selection terminal of the switch is connected to the second antenna element. The switch switches between making a conduction and making non-conduction between the common terminal and the first antenna element and conduction and non-conduction between the common terminal and the second antenna element. According to this configuration, the isolation between radio-frequency signal Sig1 and radio-frequency signal Sig2 can be improved while amplifying radio-frequency signal Sig1 and radio-frequency signal Sig2 using a single power amplifier 11.

2. Configuration of Radio-Frequency Circuit 1 and Communication Device 6 (Second Application Example)

It should be noted that, as a second application example of radio-frequency circuit 1 according to this embodiment in FIG. 1, power amplifying circuit 10 may be a transmission amplifying circuit capable of amplifying radio-frequency signal Sig1 (a first radio-frequency signal) of a first communication band having band bandwidth BW1 and radio-frequency signal Sig2 (a second radio-frequency signal) of a second communication band having a band bandwidth BW2 which is greater than band bandwidth BW1. Specifically, instead of switching amplification modes according to radio-frequency signals Sig1 and Sig2 having channel bandwidths that are in a wideness/narrowness relation, power amplifying circuit 10 may switch amplification modes according to radio-frequency signals Sig1 and Sig2 having communication band frequency bands that are in a wideness/narrowness relation.

At this time, in radio-frequency circuit 1 according to this embodiment in FIG. 1, power amplifying circuit 10 amplifies radio-frequency signal Sig1 in the amplification mode according to the APT method, and amplifies radio-frequency signal Sig2 in the amplification mode according to the ET method.

FIG. 3B is a diagram indicating an example of the distribution of a 4G-LTE communication band and a 5G-NR communication band having different band bandwidths (i.e., communication band bandwidths). In the figure, Band 25-Tx (the transmission band: 1850 MHz to 1915 MHz) of 4G-LTE and n41 (the band: 2496 MHz to 2690 MHz) of 5G-NR which have different frequency bands are written together.

As illustrated in FIG. 3B, for example, the radio-frequency signal of Band 25-Tx which has a band bandwidth of 65 MHz is a radio-frequency signal used in 4G. Furthermore, the radio-frequency signal of n41 which has a band bandwidth of 194 MHz is a radio-frequency signal used in 5G.

In the second application example of radio-frequency 1 according to this embodiment in FIG. 1, for example, the communication bands illustrated in FIG. 3B are applied. For example, a signal of 4G-LTE (Band 25-Tx) having band bandwidth BW1 of 65 MHz is applied as radio-frequency signal Sig1, and a signal of 5G-NR (n41) having band bandwidth BW2 of 194 MHz as radio-frequency signal Sig2. In other words, the band bandwidth of 5G-NR (n41) is greater than the band bandwidth of 4G-LTE (Band 25-Tx). Since the channel bandwidth tends to be wider with a wider band bandwidth, in the case of the second application example, the channel bandwidth of 5G-NR (n41) tends to be wider than the channel bandwidth of 4G-LTE (Band 25-Tx), and thus the power consumption of power amplifying circuit 10 becomes higher for the radio-frequency signal of 5G-NR (n41).

It should be noted that radio-frequency signals Sig1 and Sig2 are not limited to the above-described communication band allocation.

In the second application example of radio-frequency circuit 1 according to this embodiment in FIG. 1, for example, the communication band allocation indicated in Table 1 may be applied. For example, a signal of 4G-LTE (Band 25-Tx) is applied as radio-frequency signal Sig1, and a signal of 5G-NR (n41) is applied as radio-frequency signal Sig2. Furthermore, for example, a signal of 4G-LTE (Band 5-Tx) is applied as radio-frequency signal Sig1, and a signal of 5G-NR (n78) is applied as radio-frequency signal Sig2. Furthermore, for example, a signal of 5G-NR (n5-Tx) is applied as radio-frequency signal Sig1, and a signal of 4G-LTE (B3-Tx) is applied as radio-frequency signal Sig2.

As the frequency bandwidth of the radio-frequency signal to be amplified by the power amplifier becomes wider, the frequency for which the power amplifier has to perform amplification becomes a wider band, and thus the signal distortion component of the amplified radio-frequency signal becomes bigger. In particular, the wider the channel bandwidth of the radio-frequency signal to be amplified by the power amplifier is, the bigger the signal distortion component of the amplified radio-frequency signal becomes. Whereas, although signal distortion is generated in the ET mode, the APT mode, though inferior to the ET mode in terms of reducing power consumption, can reduce the generation of signal distortion compared to the ET mode.

In contrast, according to the second application example of this embodiment, radio-frequency signal Sig1 having relatively narrow channel bandwidth BW1 (the channel bandwidth tends to be narrow) is amplified in the APT mode and radio-frequency signal Sig2 having relatively wide channel bandwidth BW2 (the channel bandwidth tends to be wide) is amplified in the ET mode. According to this configuration, the APT mode reduces signal distortion in the amplification of radio-frequency signal Sig1 of 4G-LTE (Band 25-Tx) for which power consumption tends to be low and the ET mode enables the reduction of power consumption in the amplification of radio-frequency signal Sig2 of 5G-NR (n41) for which power consumption tends to become high. Therefore, radio-frequency circuit 1 and communication device 6 that reduce the power consumption of power amplifying circuit 10 can be provided.

It should be noted that in the second application example of radio-frequency circuit 1 according to this embodiment, the pass band of filter circuit 13 includes bandwidth BW1 of the first communication band and bandwidth BW2 of the second communication band.

According to this configuration, the power consumption of power amplifying circuit 10 when amplifying a radio-frequency signal of a communication band having a wide bandwidth can be reduced while amplifying two radio-frequency signals having different communication bands by time division.

It should be noted that the elements included in communication device 6 other than radio-frequency circuit 1 in the second application example are the same in the first application example, and thus their description is omitted.

3. Configuration of Radio-Frequency Circuit 1A and Communication Device 6A According to Variation 1 (First Application Example)

Figure 4:
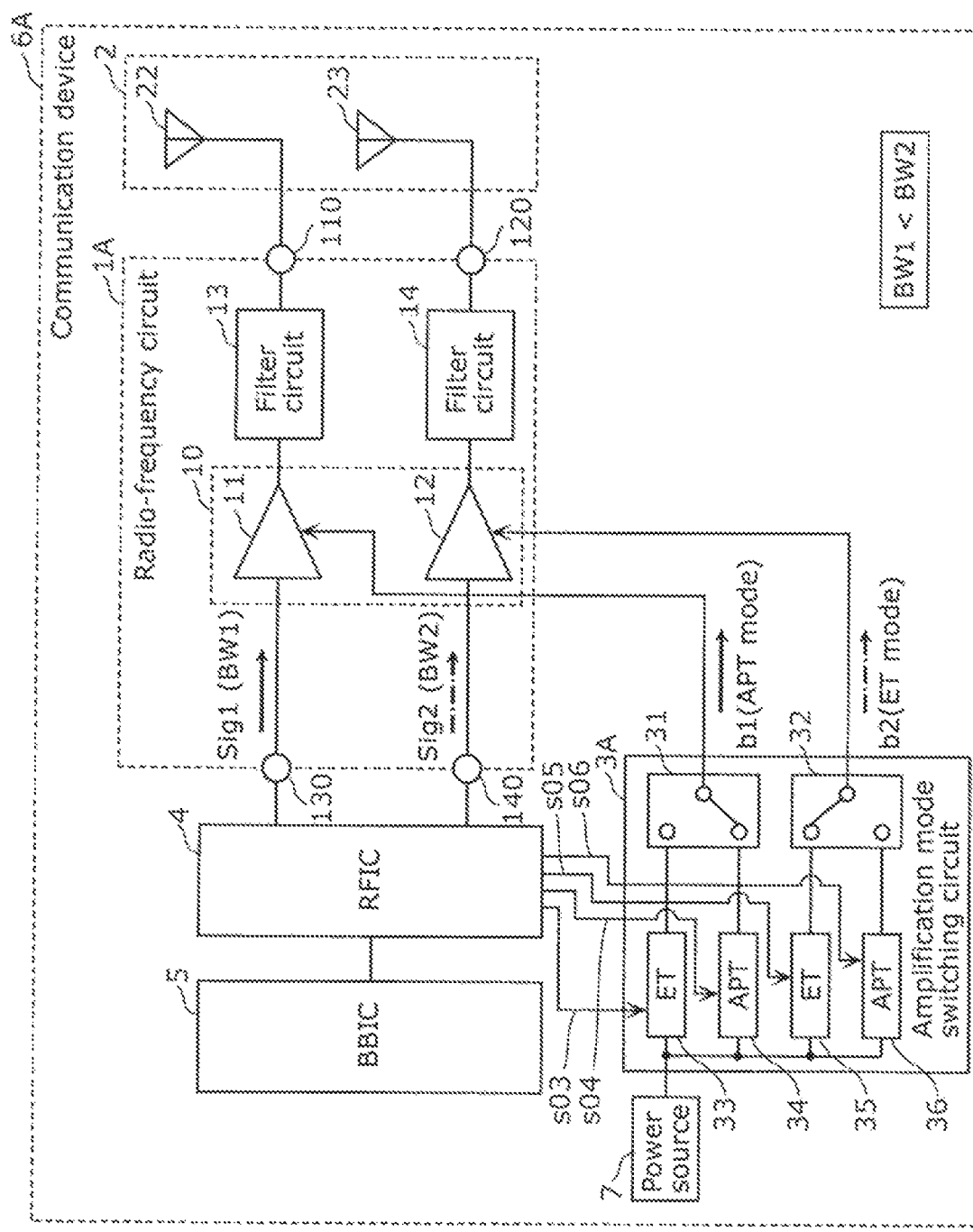
FIG. 4 is a circuit configuration diagram of a radio-frequency circuit and a communication device according to Variation 1 of the embodiment in FIG. 1.

FIG. 4 is a circuit configuration diagram of radio-frequency circuit 1A and communication device 6A according to Variation 1 of the embodiment. As illustrated in the figure, communication device 6A includes radio-frequency circuit 1A, antenna circuit 2, amplification mode switching circuit 3A, power supply 7, RFIC 4, and BBIC 5. Compared to communication device 6 according to the embodiment in FIG. 1, communication device 6A according to this Variation 1 is different in the configuration of radio-frequency circuit 1A, antenna circuit 2, and amplification mode switching circuit 3A, and in the addition of power supply 7. Hereinafter, the description of communication device 6A according to this variation will omit the elements that are the same as in communication device 6 according to the embodiment in FIG. 1 and will focus on those elements that are different.

Radio-frequency circuit 1A includes input terminals 130 and 140, output terminals 110 and 120, power amplifying circuit 10, and filter circuits 13 and 14.

Power amplifying circuit 10 includes power amplifiers 11 and 12. Power amplifier 11, which is an example of a first power amplifier, is connected between input terminal 130 and filter circuit 13. Power amplifier 12, which is an example of a second power amplifier, is connected between input terminal 140 and filter circuit 14.

As a first application example of radio-frequency 1A according to this Variation 1, power amplifying circuit 10 amplifies radio-frequency signal Sig1 (a first radio-frequency signal) having channel bandwidth BW1 (a first channel bandwidth) and radio-frequency signal Sig2 (a second radio-frequency signal) having channel bandwidth BW2 (a second channel bandwidth) which is wider than channel bandwidth BW1.

Power amplifier 11 and 12 each include, for example, bipolar amplifier transistors each having a base terminal, an emitter terminal, and a collector terminal. It should be noted that the amplifier transistors included in power amplifiers 11 and 12 are not limited to bipolar transistors, and may be MOSFETs, and the like, for example.

A bias signal (a direct current bias voltage or a direct current bias current) is supplied to the base terminal and a direct current power supply voltage is supplied to the collector terminal of each of the amplifier transistors included in power amplifiers 11 and 12. Changing (the voltage or current of) the bias signal supplied to the base terminal of each of the amplifier transistors optimizes the operating point of the respective amplifier transistors.

Filter circuit 13, which is an example of a first filter, is connected between the output terminal of power amplifier 11 and output terminal 110, and allows the radio-frequency signal amplified by power amplifier 11 to pass with low loss. Filter circuit 14, which is an example of a second filter, is connected between the output terminal of power amplifier 12 and output terminal 120, and allows the radio-frequency signal amplified by power amplifier 12 to pass with low loss.

It should be noted that power amplifiers 11 and 12 may be integrated in a single chip. Furthermore, power amplifiers 11 and 12 and filter circuits 13 and 14 may be mounted on a single mounting board. According to this configuration, radio-frequency circuit 1A can be miniaturized.

It should be noted that filter circuits 13 and 14, input terminals 130 and 140, and output terminals 110 and 120 are not necessarily essential elements of radio-frequency circuit 1A according to this variation.

Here, in the first application example of radio-frequency circuit 1A according to this Variation 1, power amplifying circuit 10 amplifies radio-frequency signal Sig1 in the amplification mode according to the APT method, and amplifies radio-frequency signal Sig2 in the amplification mode according to the ET method.

For example, power amplifier 11 amplifies radio-frequency signal Sig1, and power amplifier 12 amplifies radio-frequency signal Sig2. It should be noted that radio-frequency circuit 1A can simultaneously amplify radio-frequency signal Sig1 and radio-frequency signal Sig2.

According to the first application example of radio-frequency circuit 1A according to this Variation 1, power amplifier 11 can amplify radio-frequency signal Sig1 having a relatively narrow channel bandwidth in the APT mode, and power amplifier 12 can amplify radio-frequency signal Sig2 having a relatively wide channel bandwidth in the ET mode. According to this configuration, the APT mode reduces signal distortion in the amplification of radio-frequency signal Sig1 for which power consumption is low, and the ET mode enables the reduction of power consumption of power amplifying circuit 10 in the amplification of radio-frequency signal Sig2 for which power consumption is high. Therefore, radio-frequency circuit 1A and communication device 6A that reduce the power consumption of power amplifying circuit 10 while simultaneously amplifying two radio-frequency signals having different channel bandwidths can be provided.

In the first application example of radio-frequency 1A according to this variation, for example, the channel allocation illustrated in FIG. 3A is applied. For example, a signal having channel bandwidth BW1 (10 MHZ) of 4G-LTE (Band 41) is applied as radio-frequency signal Sig1, and a signal having channel bandwidth BW2 (50 MHz) of 5G-NR (n41) is applied as radio-frequency signal Sig2. In this case, channel bandwidth BW2 (50 MHz) of 5G-NR (n41) is wider than channel bandwidth BW1 (10 MHZ) of 4G-LTE (Band 41).

It should be noted that radio-frequency signals Sig1 and Sig2 are not limited to the above-described channel allocation.

In the first application example of radio-frequency circuit 1A according to this Variation 1, for example, the channel allocation indicated in Table 1 may be applied. For example, a signal having channel bandwidth BW1 (10 MHZ) of 4G-LTE (Band 25-Tx) is applied as radio-frequency signal Sig1, and a signal having channel bandwidth BW2 (50 MHz) of 5G-NR (n41) is applied as radio-frequency signal Sig2. Furthermore, for example, a signal having channel bandwidth BW1 (10 MHZ) of 4G-LTE (Band 5-Tx) is applied as radio-frequency signal Sig1, and a signal having channel bandwidth BW2 (50 MHz) of 5G-NR (n78) is applied as radio-frequency signal Sig2. Furthermore, for example, a signal having channel bandwidth BW1 (10 MHZ) of 5G-NR (Band n5-Tx) is applied as radio-frequency signal Sig1, and a signal having channel bandwidth BW2 (20 MHz) of 4G-LTE (B3-Tx) is applied as radio-frequency signal Sig2.

As the frequency bandwidth of the radio-frequency signal to be amplified by the power amplifier becomes wider, the frequency for which the power amplifier has to perform amplification becomes a wider band, and thus the signal distortion component of the amplified radio-frequency signal becomes bigger. In particular, the wider the channel bandwidth of the radio-frequency signal to be amplified by the power amplifier is, the bigger the signal distortion component of the amplified radio-frequency signal becomes. Whereas, although signal distortion is generated in the ET mode, the APT mode, though inferior to the ET mode in terms of reducing power consumption, can reduce the generation of signal distortion compared to the ET mode.

According to the first application example of this Variation 1, power amplifier 11 to which radio-frequency signal Sig1 is input is configured to amplify in the APT mode, and power amplifier 12 to which radio-frequency signal Sig2 is input is configured to amplify in the ET mode. According to this configuration, the APT mode reduces signal distortion in the amplification of radio-frequency signal Sig1 of 4G-LTE (Band 41) for which power consumption is low and the ET mode enables the reduction of power consumption in the amplification of radio-frequency signal Sig2 of 5G-NR (n41) for which power consumption is high. Therefore, radio-frequency circuit 1A and communication device 6A that reduce the power consumption of power amplifying circuit 10 can be provided.

It should be noted that in radio-frequency circuit 1A according to this Variation 1, the amplification of radio-frequency signal Sig1 by power amplifier 11 and the amplification of radio-frequency signal Sig2 by power amplifier 12 can be simultaneously executed. According to this configuration, the power consumption of power amplifying circuit 10 when amplifying of radio-frequency signal Sig2 which has a wide channel bandwidth can be reduced while simultaneously amplifying two radio-frequency signals having different channel bandwidths.

Furthermore, in this variation, power amplifier 11 amplifies radio-frequency signal Sig1 and power amplifier 12 amplifies radio-frequency signal Sig2, but are not limited to this. In radio-frequency circuit 1A, power amplifier 11 may amplify radio-frequency signal Sig2 and power amplifier 12 may amplify radio-frequency signal Sig1, or each of power amplifiers 11 and 12 may be capable of amplifying either radio-frequency signal Sig1 or Sig2. Specifically, when power amplifier 11 amplifies one of radio-frequency signals Sig1 and Sig2, power amplifier 12 may amplify the other of radio-frequency signals Sig1 and Sig2. For this reason, the amplification of radio-frequency signal Sig2 by power amplifier 11 and the amplification of radio-frequency signal Sig1 by power amplifier 12 can be simultaneously executed.

The correspondence relation between power amplifiers 11 and 12 and radio-frequency signals Sig1 and Sig2 may be determined by RFIC 4.

Hereinafter, elements included in communication device 6A other than radio-frequency circuit 1A will be described.

Antenna circuit 2 includes antenna elements 22 and 23. Antenna element 22 is connected to output terminal 110 of radio-frequency circuit 1A, transmits the radio-frequency signal amplified by power amplifier 11, and receives a radio-frequency signal transmitted from another communication device (a base station, and the like). Antenna element 23 is connected to output terminal 120 of radio-frequency circuit 1A, transmits the radio-frequency signal amplified by power amplifier 12, and receives a radio-frequency signal transmitted from another communication device (a base station, and the like). By transmitting the radio-frequency signal output from power amplifier 11 and the radio-frequency signal output from power amplifier 12 from different antenna elements, two radio-frequency signals having different channel bandwidths can be transmitted or received with high isolation.

RFIC 4 is an RF signal processing circuit that processes a radio-frequency signal. Specifically, RFIC 4 performs, by upconversion, etc., signal processing on a transmission signal input from BBIC 5, and outputs the radio-frequency transmission signal generated by the signal processing to radio-frequency circuit 1A.

BBIC 5 is a circuit that performs signal processing using an intermediate frequency band having a lower frequency than the radio-frequency signal propagating in radio-frequency circuit 1A. The signal processed by BBIC 5 is, for example, used as an image signal for image display or as a sound signal for conversation via a speaker.

RFIC 4 and BBIC 5 are signal processing circuits that process radio-frequency signals.

Next, a specific configuration example of amplification mode switching circuit 3A included in communication device 6A will be described. Amplification mode switching circuit 3A is disposed between the controller of RFIC 4 and power amplifiers 11 and 12. Amplification mode switching circuit 3A includes switches 31 and 32, ET power supply circuits 33 and 35, and APT power supply circuits 34 and 36.

ET power supply circuit 33 is a bias circuit that is connected to power supply 7 and applies ET mode bias signal b2 to one of the selection terminals of switch 31 based on control signal s03 that is output by the controller of RFIC 4. ET power supply circuit 35 is a bias circuit that is connected to power supply 7 and applies ET mode bias signal b2 to one of the selection terminals of switch 32 based on control signal s05 that is output by the controller of RFIC 4.

APT power supply circuit 34 is a bias circuit that is connected to power supply 7 and applies APT mode bias signal b1 to the other of the selection terminals of switch 31 based on control signal s04 that is output by the controller of RFIC 4. APT power supply circuit 36 is a bias circuit that is connected to power supply 7 and applies APT mode bias signal b1 to the other of the selection terminals of switch 32 based on control signal s06 that is output by the controller of RFIC 4.

Switch 31 is a SPDT switch that includes one common terminal and two selection terminals; the common terminal is connected to power amplifier 11, the one of the selection terminals is connected to ET power supply circuit 33, and the other of the selection terminals is connected to APT power supply circuit 34.

Switch 32 is a SPDT switch that includes one common terminal and two selection terminals; the common terminal is connected to power amplifier 12, the one of the selection terminals is connected to ET power supply circuit 35, and the other of the selection terminals is connected to APT power supply circuit 36.

It should be noted that ET power supply circuits 33 and 35 need not to be separate power supply circuits, and may be a single power supply circuit. In this case, the aforementioned single power supply circuit has a circuit configuration that enables the distribution of ET mode bias signal b2 to switches 31 and 32. Furthermore, APT power supply circuits 34 and 36 need not to be separate power supply circuits, and may be a single power supply circuit. In this case, the aforementioned single power supply circuit has a circuit configuration that allows distribution of APT mode bias signal b1 to switches 31 and 32.

Moreover, ET power supply circuit 33 and APT power supply circuit 34 need not to be separate power supply circuits, and may be a single power supply circuit. In this case, switch 31 becomes unnecessary, and the aforementioned single power supply circuit has a circuit configuration that enables application of APT mode bias signal b1 and ET mode bias signal b2 to power amplifier 11 by time division. Moreover, ET power supply circuit 35 and APT power supply circuit 36 need not to be separate power supply circuits, and may be a single power supply circuit. In this case, switch 32 becomes unnecessary, and the aforementioned single power supply circuit has a circuit configuration that enables application of ET mode bias signal b2 and APT mode bias signal b1 to power amplifier 12 by time division.

Furthermore, power supply 7 is for generating the bias signals output by ET power supply circuits 33 and 35 and APT power supply circuits 34 and 36. Power supply 7 need not to be included in communication device 6A and may be provided outside thereof.

According to the above-described configuration, amplification mode switching circuit 3A switches between supplying bias signal b1 (a first bias signal) corresponding to the APT method and supplying bias signal b2 (a second bias signal) corresponding to the ET method, to power amplifier 11, based on control signals s03 and s04 output from the controller of RFIC 4. Furthermore, amplification mode switching circuit 3A switches between supplying bias signal b1 (a first bias signal) corresponding to the APT method and supplying bias signal b2 (a second bias signal) corresponding to the ET method, to power amplifier 12, based on control signals s05 and s06 output from the controller of RFIC 4.

RFIC 4 includes a controller (e.g., a processor) that outputs a control signal for controlling whether power amplifiers 11 and 12 operate in the ET mode or the APT mode, based on information on which of radio-frequency signal Sig1 or Sig2 is to be output to radio-frequency circuit 1A. The controller of RFIC 4 determines, based on information (for example, a communication band or channel information) of a radio-frequency signal sent from a mobile system base station, the radio frequency signals to be output to input terminals 130 and 140 of radio-frequency circuit 1A, and outputs the radio-frequency signals.

It should be noted that in radio-frequency circuit 1A and communication device 6A according to this Variation 1, power amplifiers 11 and 12 may amplify radio-frequency signal Sig1 according to the APT method and amplify radio-frequency signal Sig2 according to the ET method, when the value indicating the output power of the radio-frequency signal output from power amplifier 11 or 12 is greater than the threshold power.

In this case, RFIC 4 obtains a power value corresponding to the output power of power amplifier 11 by measuring a power using a coupler disposed in a path from the output terminal of power amplifier 11 to antenna element 22. Furthermore, the controller of RFIC 4, for example, obtains the power value corresponding to the output power of power amplifier 12 by measuring a power using a coupler disposed in a path from the output terminal of power amplifier 12 to antenna element 23. Specifically, by obtaining the measurement results for the output power of power amplifiers 11 and 12, the controller causes radio-frequency signal Sig1 to be amplified according to the APT method and radio-frequency signal Sig2 to be amplified according to the ET method, when the values indicating the output power of power amplifiers 11 and 12 are greater than the threshold power.

It should be noted that the way in which the controller of RFIC 4 obtains the power values corresponding to the output power of power amplifiers 11 and 12 may be by measurement using a power-measuring device other than a coupler. Furthermore, the controller of RFIC 4 may obtain, as the value indicating the output power of power amplifiers 11 and 12, a required power sent from a mobile system base station which is the output power required from a radio-frequency transmission signal to be transmitted from communication device 6A. In this manner, in the case of predicting the output power of power amplifiers 11 and 12 based on the required power sent from a mobile system base station, the controller causes radio-frequency signal Sig1 to be amplified in the amplification mode according to the APT method and radio-frequency signal Sig2 to be amplified in the amplification mode according to the ET method, when the values indicating the output power of power amplifiers 11 and 12 are greater than the threshold power.

According to the above-described configuration of communication device 6A, the signal distortion of the amplified radio-frequency signals can be reduced using a simplified circuit configuration.

It should be noted that, in the case of the ET mode, as the tracking property of the bias voltage for an input modulated signal becomes higher, the distortion characteristics of the output signal tends to deteriorate. In contrast, in the case of the APT mode, reduction of power consumption is inferior to the ET mode but the generation of signal distortion can be reduced as compared to the ET mode.

ET power supply circuits 33 and 35 change the ET power supply voltage to correspond with the power amplitude of radio-frequency signal Sig2 to be input to power amplifying circuit 10 (or to be output from power amplifying circuit 10). According to this change of the ET power supply voltage, bias signal b2 (bias voltage) applied to power amplifying circuit 10 varies by a second tracking degree relative to the power amplitude of radio-frequency signal Sig2, with a predetermined delay time.

Furthermore, APT power supply circuits 34 and 36 change the APT power supply voltage to conform with the power amplitude of radio-frequency signal Sig2 to be input to power amplifying circuit 10 (or to be output from power amplifying circuit 10). According to this change of the APT power supply voltage, bias signal b1 (bias voltage) applied to power amplifying circuit 10 varies by a first tracking degree relative to the power amplitude of radio-frequency signal Sig1, with a predetermined delay time.

Since radio-frequency signal Sig2 has a wide channel bandwidth compared to radio-frequency signal Sig1, the amplitude change period indicated by the channel bandwidth reciprocal (1/BW) is short. Furthermore, radio-frequency signal Sig2 has a large PAPR as compared to radio-frequency signal Sig1.

For this reason, in communication device 6A according to this Variation 1, the second tracking degree of bias signal b2 may be higher than the first tracking degree of bias signal b1.

According to this configuration, when radio-frequency signal Sig2 having a relatively wide channel bandwidth is to be input to power amplifying circuit 10, bias signal b2 having high tracking property is applied to power amplifying circuit 10, and when radio-frequency signal Sig1 having a relatively narrow channel bandwidth is to be input to power amplifying circuit 10, bias signal b1 having low tracking property is applied to power amplifying circuit 10. In other words, the bias signal is optimized according to the channel bandwidth of the radio-frequency signal to be input. For this reason, even when the channel bandwidths of the radio-frequency signals to be input are different, signal distortion can be reduced as compared to when the same bias signal b2 is applied. Furthermore, even when the channel bandwidths of the radio-frequency signals to be input are different, power consumption can be reduced compared to when the same bias signal b1 is applied. According to this configuration, a plurality of radio-frequency signals having different channel bandwidths can be amplified by power amplifying circuit 10 while ensuring high amplification performance and low power consumption.

It should be noted that the tracking property (e.g., a tracking performance) of bias voltage relative to the input power amplitude is the responsiveness of a bias voltage to the change in the power amplitude of the radio-frequency signal input to power amplifying circuit 10 (or output from power amplifying circuit 10), and is equivalent to the transition time (a rise time or a fall time) during the step response of the bias voltage, for example. Specifically, a high tracking property means that responsiveness is high and a transition time is short.

Specifically, in radio-frequency circuit 1A and communication device 6A according to this Variation 1, when radio-frequency signal Sig1 having a relatively small PAPR is input to power amplifying circuit 10, bias signal b1 having a relatively low tracking property is applied from APT power supply circuits 34 and 36 to power amplifying circuit 10. On the other hand, when radio-frequency signal Sig2 having a relatively large PAPR is input to power amplifying circuit 10, bias signal b2 having a relatively high tracking property is applied from ET power supply circuits 33 and 35 to power amplifying circuit 10.

It should be noted that, from the viewpoint of the tracking property described above, in radio-frequency circuit 1A and communication device 6A according to this Variation 1, ET power supply circuits 33 and 35 may be disposed closer to RFIC 4 than APT power supply circuits 34 and 36 are. Furthermore, ET power supply circuits 33 and 35 may be disposed closer to power amplifying circuit 10 than APT power supply circuits 34 and 36 are. According to this configuration, the control lines connecting RFIC 4 and ET power supply circuits 33 and 35 and the bias signal lines connecting ET power supply circuits 33 and 35 and power amplifying circuit 10 can be made relatively short, and thus it is possible to improve the tracking property of bias signal b2 from which a tracking property higher than that of bias signal b1 is demanded.

Furthermore, the tracking property (a second tracking degree) of bias signal b2 is higher than the tracking property (a first tracking degree) of bias signal b1 means that the tracking property of bias signal b2 output by ET power supply circuits 33 and 35 is higher than the tracking property of bias signal b1 output by APT power supply circuits 34 and 36. In order to realize this, for example, the dynamic range of bias voltages to be output from ET power supply circuits 33 and 35 may be larger than the dynamic range of bias voltages output from APT power supply circuits 34 and 36. Furthermore, for example, the response speed from when control signals 03 and 05 are detected to when the bias voltages are output by ET power supply circuits 33 and 35 may be higher than the response speed from when control signals 04 and 06 are detected to when the bias voltages are output by APT power supply circuits 34 and 36.

It should be noted that although amplification mode switching circuit 3A is included in communication device 6A and is outside radio-frequency circuit 1A in this Variation 1, the present disclosure is not limited to this configuration. Radio-frequency circuit 1A may include amplification mode switching circuit 3A. In addition, radio-frequency circuit 1A may include switches 31 and 32 of amplification mode switching circuit 3A. For example, switches 31 and 32 may be mounted on the mounting board of radio-frequency circuit 1A. Specifically, radio-frequency circuit 1A according to this variation may further include switch 31 that switches between supplying bias signal b1 corresponding to the APT mode to power amplifier 11 and supplying bias signal b2 corresponding to the ET mode to power amplifier 11, and switch 32 that switches between supplying bias signal b1 corresponding to the APT mode to power amplifier 12 and supplying bias signal b2 corresponding to the ET mode to power amplifier 12.

The amplification mode of power amplifiers 11 and 12 is determined by the supply specification of the bias signals for the amplifier transistors included in power amplifiers 11 and 12. According to the above-described configuration, the supply of bias signals to power amplifiers 11 and 12 is switched by switches 31 and 32 included in radio-frequency circuit 1A, and thus radio-frequency circuit 1A capable of switching amplification modes using a simplified circuit configuration can be realized.

It should be noted that although one of radio-frequency signals Sig1 and Sig2 is a signal used in 4G and the other of radio-frequency signals Sig1 and Sig2 is a signal used in 5G in radio-frequency circuit 1A according to this variation, they are not limited to such signals. In radio-frequency circuit 1A according to this Variation 1, radio-frequency signal Sig1 may be a signal used in 4G and radio-frequency signal Sig2 may also be a signal used in 4G.

According to this configuration, the ET mode promotes low power consumption in the amplification of radio-frequency signal Sig1 of 4G-LTE which has a narrow channel bandwidth, and the APT mode enables the reduction of signal distortion in the amplification of radio-frequency signal Sig2 of 4G-LTE which has a narrow channel bandwidth. Therefore, in radio-frequency circuit 1A and communication device 6A that transfer 4G-LTE radio-frequency signals, signal distortion can be reduced.

In radio-frequency circuit 1A according to this variation, radio-frequency signal Sig1 may be a signal used in 5G and radio-frequency signal Sig2 may also be a signal used in 5G.

According to this configuration, the APT mode promotes low power consumption in the amplification of radio-frequency signal Sig1 of 5G-NR which has a narrow channel bandwidth, and the ET mode enables the reduction of signal distortion in the amplification of radio-frequency signal Sig2 of 5G-NR which has a narrow channel bandwidth. Therefore, in radio-frequency circuit 1A and communication device 6A that transfer 5G-NR radio-frequency signals, signal distortion can be reduced.

Furthermore, in radio-frequency circuit 1A according to this Variation 1, the case where radio-frequency signal Sig1 used in 4G and radio-frequency signal Sig2 used in 5G can be simultaneously transmitted is given as an example, radio-frequency circuit 1A can also be applied to a case where radio-frequency signals used in two different channels conforming to mobile communication systems of the same generation can be simultaneously transmitted (what is called carrier aggregation). Specifically, radio-frequency circuit 1A can also be applied to (1) the case of simultaneously transmitting radio-frequency signal Sig1 used in 4G and radio-frequency signal Sig2 used in 4G and (2) the case of simultaneously transmitting radio-frequency signal Sig1 used in 5G and radio-frequency signal Sig2 used in 5G.

4. Configuration of Radio-Frequency Circuit 1A and Communication Device 6A According to Variation 1 (Second Application Example)

It should be noted that, as a second application example of radio-frequency circuit 1A according to Variation 1, power amplifying circuit 10 may be a transmission amplifying circuit capable of amplifying radio-frequency signal Sig1 (a first radio-frequency signal) of a first communication band having band bandwidth BW1 and radio-frequency signal Sig2 (a second radio-frequency signal) of a second communication band having a band bandwidth BW2 which is greater than band bandwidth BW1. Specifically, instead of switching amplification modes according to radio-frequency signals Sig1 and Sig2 having channel bandwidths that are in a wideness/narrowness relation, power amplifying circuit 10 may switch amplification modes according to radio-frequency signals Sig1 and Sig2 having communication band frequency bands that are in a wideness/narrowness relation.

At this time, in radio-frequency circuit 1A according to this Variation 1, for example, power amplifier 11 amplifies radio-frequency signal Sig1 in the amplification mode according to the APT method, and power amplifier 12 amplifies radio-frequency signal Sig2 in the amplification mode according to the ET method. In this case, the passband of filter circuit 13 corresponds to band bandwidth BW1, and the passband of filter circuit 14 corresponds to band bandwidth BW2. Furthermore, the gain bandwidth of power amplifier 11 corresponds to band bandwidth BW1, and the gain bandwidth of power amplifier 12 corresponds to band bandwidth BW2. It should be noted that in this disclosure, a gain bandwidth is defined as the bandwidth in which a power amplifier is capable of amplifying a radio-frequency signal by at least a predetermined gain.

In the second application example of radio-frequency 1A according to this variation, for example, the communication bands illustrated in FIG. 3B are applied. For example, a signal of 4G-LTE (Band 25-Tx) having band bandwidth BW1 of 65 MHz is applied as radio-frequency signal Sig1, and a signal of 5G-NR (n41) having band bandwidth BW2 of 194 MHz as radio-frequency signal Sig2. In other words, the band bandwidth of 5G-NR (n41) is greater than the band bandwidth of 4G-LTE (Band 25-Tx). Since the channel bandwidth tends to be wider with a wider band bandwidth, in the case of the second application example, the channel bandwidth of 5G-NR (n41) tends to be wider than the channel bandwidth of 4G-LTE (Band 25-Tx), and thus signal distortion becomes bigger in the radio-frequency signal of 5G-NR (n41). It should be noted that radio-frequency signals Sig1 and Sig2 are not limited to the above-described communication band allocation.

In the second application example of radio-frequency circuit 1A according to this Variation 1, for example, the communication band allocation indicated in Table 1 may be applied. For example, a signal of 4G-LTE (Band 25-Tx) is applied as radio-frequency signal Sig1, and a signal of 5G-NR (n41) is applied as radio-frequency signal Sig2. Furthermore, for example, a signal of 4G-LTE (Band 5-Tx) is applied as radio-frequency signal Sig1, and a signal of 5G-NR (n78) is applied as radio-frequency signal Sig2. Furthermore, for example, a signal of 5G-NR (n5-Tx) is applied as radio-frequency signal Sig1, and a signal of 4G-LTE (B3-Tx) is applied as radio-frequency signal Sig2.

As the frequency bandwidth of the radio-frequency signal to be amplified by the power amplifier becomes wider, the frequency for which the power amplifier has to perform amplification becomes a wider band, and thus the signal distortion component of the amplified radio-frequency signal becomes bigger. In particular, the wider the channel bandwidth of the radio-frequency signal to be amplified by the power amplifier is, the bigger the signal distortion component of the amplified radio-frequency signal becomes. Whereas, although signal distortion is generated in the ET mode, the APT mode, though inferior to the ET mode in terms of reducing power consumption, can reduce the generation of signal distortion compared to the ET mode.

According to the second application example of this Variation 1, radio-frequency signal Sig1 having relatively narrow channel bandwidth BW1 (the channel bandwidth tends to be narrow) is amplified in the ATP mode and radio-frequency signal Sig2 having relatively wide channel bandwidth BW2 (the channel bandwidth tends to be wide) is amplified in the ET mode. According to this configuration, the APT mode reduces signal distortion in the amplification of radio-frequency signal Sig1 of 4G-LTE (Band 25-Tx) for which power consumption tends to be small and the ET mode enables the reduction of power consumption in the amplification of radio-frequency signal Sig2 of 5G-NR (n41) for which power consumption tends to become big. Therefore, radio-frequency circuit 1A and communication device 6A that reduce the power consumption of power amplifying circuit 10 can be provided.

It should be noted that in radio-frequency circuit 1A according to this Variation 1, the amplification of radio-frequency signal Sig1 by power amplifier 11 and the amplification of radio-frequency signal Sig2 by power amplifier 12 can be simultaneously executed. According to this configuration, the signal distortion of radio-frequency signal Sig2 which has a wide band bandwidth can be reduced while simultaneously amplifying two radio-frequency signals having different band bandwidths.

Furthermore, in this variation, power amplifier 11 amplifies one of radio-frequency signal Sig1 and radio-frequency signal Sig2, and power amplifier 12 amplifies the other of radio-frequency signal Sig1 and radio-frequency signal Sig2, but are not limited to this configuration. In radio-frequency circuit 1A, power amplifier 11 may amplify radio-frequency signal Sig2 and power amplifier 12 may amplify radio-frequency signal Sig1, or it is acceptable that each of power amplifiers 11 and 12 can amplify either radio-frequency signals Sig1 or Sig2. Specifically, when power amplifier 11 amplifies one of radio-frequency signals Sig1 and Sig2, power amplifier 12 may amplify the other of radio-frequency signals Sig1 and Sig2. For this reason, the amplification of radio-frequency signal Sig2 by power amplifier 11 and the amplification of radio-frequency signal Sig1 by power amplifier 12 can be simultaneously executed.

The correspondence relation between power amplifiers 11 and 12 and radio-frequency signals Sig1 and Sig2 may be determined by RFIC 4.

It should be noted that the elements included in communication device 6A other than radio-frequency circuit 1A in the second application example are the same in the first application example of Variation 1, and thus their description is omitted.

5. Configuration of Radio-Frequency Circuit 1B and Communication Device 6B According to Variation 2

Figure 5:
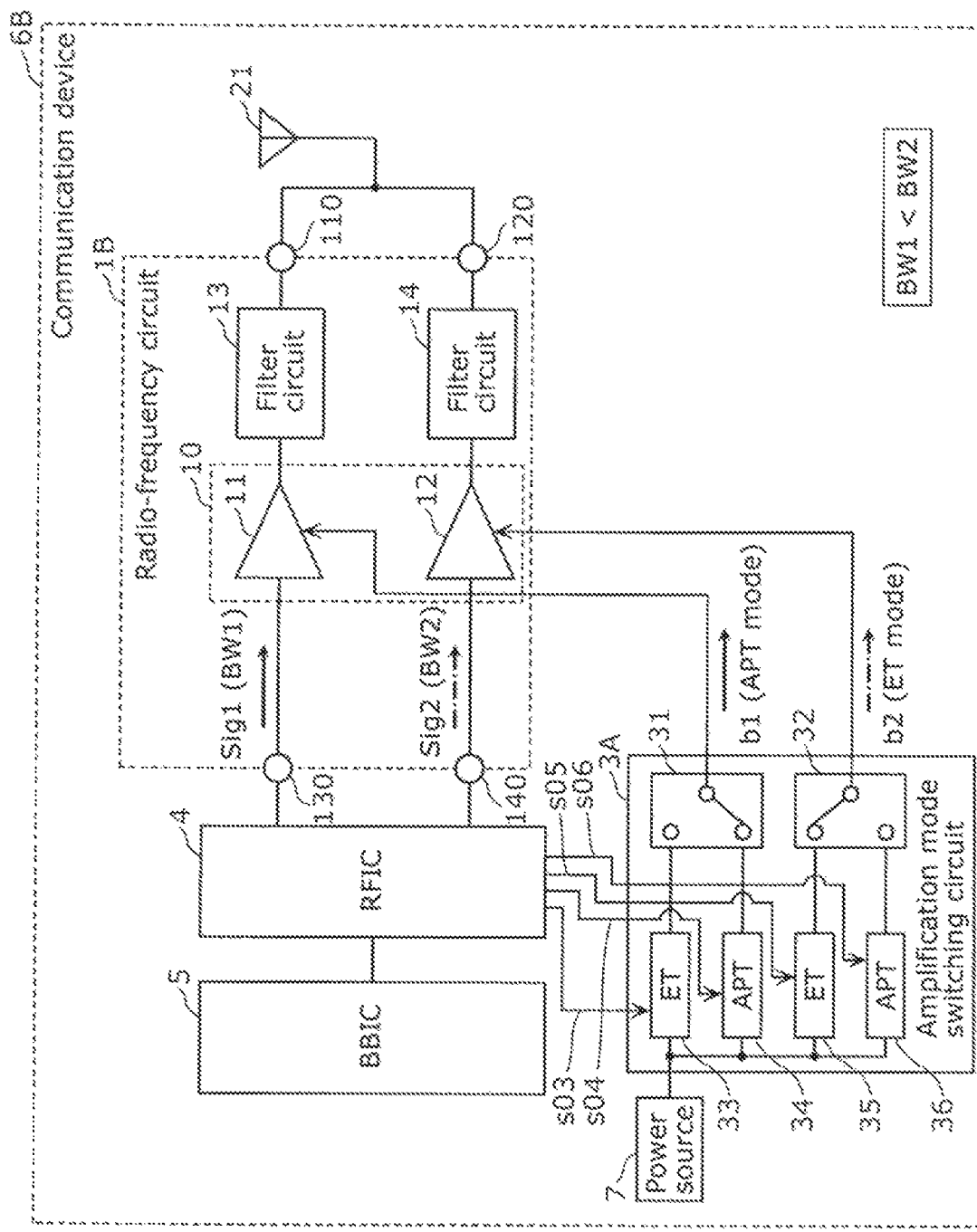
FIG. 5 is a circuit configuration diagram of a radio-frequency circuit and a communication device according to Variation 2 of the embodiment in FIG. 1.

FIG. 5 is a circuit configuration diagram of radio-frequency circuit 1B and communication device 6B according to Variation 2 of the embodiment in FIG. 1. As illustrated in the figure, communication device 6B includes radio-frequency circuit 1B, antenna element 21, amplification mode switching circuit 3A, power supply 7, RFIC 4, and BBIC 5. Compared to communication device 6A according to Variation 1, communication device 6B according to this Variation 2 is different only in the configuration of the antenna circuit. Hereinafter, the description of communication device 6B according to this Variation 2 will omit the elements that are the same as in communication device 6A according to Variation 1 and will focus on those elements that are different.

Antenna element 21 is connected to output terminals 110 and 120 of radio-frequency circuit 1B, transmits the radio-frequency signals amplified by power amplifiers 11 and 12, and receives a radio-frequency signal transmitted from another communication device (a base station, and the like). The radio-frequency signal output from power amplifier 11 and the radio-frequency signal output from power amplifier 12 are transmitted from the same antenna element 21. Therefore, a small-sized communication device 6B that reduces signal distortion of a radio-frequency signal can be provided.

6. Advantageous Effects

As described above, according to this embodiment and the variations, radio-frequency circuit 1 includes power amplifying circuit 10 that amplifies radio-frequency signal Sig1 having channel bandwidth BW1 and radio-frequency signal Sig2 having channel bandwidth BW2 greater than channel bandwidth BW1. Power amplifying circuit 10 amplifies radio-frequency signal Sig1 in an amplifying mode according to the APT method, and amplifies radio-frequency signal Sig2 in an amplifying mode according to the ET method.

According to this configuration, radio-frequency signal Sig2 which has a wider channel bandwidth than radio-frequency signal Sig1 is amplified in the ET mode, and thus the power consumption of power amplifying circuit 10 when amplifying radio-frequency signal Sig2 having a wide channel bandwidth can be reduced.

Furthermore, power amplifying circuit 10 includes power amplifier 11, and power amplifier 11 may amplify radio-frequency signal Sig1 and radio-frequency signal Sig2 by time division.

According to this configuration, the power consumption of power amplifying circuit 10 when amplifying radio-frequency signal Sig2 which has a wide channel bandwidth can be reduced while amplifying two radio-frequency signals having different channel bandwidths by time division.

Furthermore, power amplifying circuit 10 may include power amplifiers 11 and 12. Power amplifier 11 may amplify one of radio-frequency signal Sig1 and radio-frequency signal Sig2, and power amplifier 12 may amplify the other of radio-frequency signal Sig1 and radio-frequency signal Sig2. Radio-frequency circuit 1A may be capable of simultaneously amplifying radio-frequency signal Sig1 and radio-frequency signal Sig2.

According to this configuration, the power consumption of power amplifying circuit 10 when amplifying radio-frequency signal Sig2 which has a wide channel bandwidth can be reduced while simultaneously amplifying two radio-frequency signals having different channel bandwidths.

Furthermore, radio-frequency circuit 1A may further include output terminal 110 through which a radio-frequency signal amplified by power amplifier 11 is output, and output terminal 120 through which a radio-frequency signal amplified by power amplifier 12 is output. Output terminal 110 and output terminal 120 may be connected to mutually different antenna elements 22 and 23, respectively.

According to this configuration, the power consumption of power amplifying circuit 10 when amplifying radio-frequency signal Sig2 which has a wide channel bandwidth can be reduced while ensuring high isolation between two radio-frequency signals having different channel bandwidths.

Furthermore, according to this embodiment, radio-frequency circuit 1 includes power amplifying circuit 10 that amplifies radio-frequency signal Sig1 of a first communication band having communication bandwidth BW1 and radio-frequency signal Sig2 of a second communication band having communication bandwidth BW2 wider than communication bandwidth BW1. Power amplifying circuit 10 amplifies radio-frequency signal Sig1 in an amplification mode according to the APT method, and amplifies radio-frequency signal Sig2 in an amplifying mode according to ET method.

According to this configuration, radio-frequency signal Sig2 which has a wider band bandwidth than radio-frequency signal Sig1 is amplified in the APT mode, and thus the power consumption of power amplifying circuit 10 when amplifying radio-frequency signal Sig2 having a wide band bandwidth can be reduced.

Furthermore, power amplifying circuit 10 may include power amplifier 11, radio-frequency circuit 1 may further include filter circuit 13 connected to an output terminal of the first power amplifier, and filter circuit 13 may have a passband that includes a frequency band of the first communication band and a frequency band of the second communication band.

According to this configuration, the power consumption of power amplifying circuit 10 when amplifying a radio-frequency signal having a wide bandwidth can be reduced while amplifying two radio-frequency signals having different communication bands by time division.

Furthermore, power amplifying circuit 10 may include: power amplifier 11 that amplifies radio-frequency signal Sig1; and power amplifier 12 that amplifies radio-frequency signal Sig2. Radio-frequency circuit 1A may further include filter circuit 13 connected to an output terminal of power amplifier 11 and having a passband that includes a frequency band of the first communication band, and filter circuit 14 connected to an output terminal of power amplifier 12 and having a passband that includes a frequency band of the second communication band, and radio-frequency circuit 1A may be capable of simultaneously amplifying radio-frequency signal Sig1 and radio-frequency signal Sig2.

According to this configuration, the power consumption of power amplifying circuit 10 when amplifying radio-frequency signal Sig2 which has a wide band bandwidth can be reduced while simultaneously amplifying two radio-frequency signals having different band bandwidths.

Furthermore, in radio-frequency circuits 1, 1A, and 1B, radio-frequency signal Sig1 may be a signal used in 4G, and radio-frequency signal Sig2 may be a signal used in 5G.

According to this configuration, simultaneous transfer of 4G and 5G (EN-DC: E-UTRA-NR-dual connectivity) can be executed while reducing the power consumption of power amplifying circuit 10 when amplifying radio-frequency signal Sig2 which has a relatively wide channel bandwidth or band bandwidth.

Furthermore, radio-frequency signal Sig1 may be a signal used in 4G, and radio-frequency signal Sig2 may be a signal of WLAN.

Furthermore, the PAPR of radio-frequency signal Sig2 may be larger than the PAPR of radio-frequency signal Sig1.

Furthermore, radio-frequency signal Sig1 may be a signal of WLAN, and radio-frequency signal Sig2 may be a signal used in 5G.

Furthermore, in radio-frequency circuits 1, 1A, and 1B, radio-frequency signal Sig1 may be a signal used in 4G, and radio-frequency signal Sig2 may be a signal used in 4G.

According to this configuration, 4G carrier aggregation can be executed while reducing the power consumption of power amplifying circuit 10 when amplifying radio-frequency signal Sig2 which has a relatively wide channel bandwidth or band bandwidth.

Furthermore, in radio-frequency circuits 1, 1A, and 1B, radio-frequency signal Sig1 may be a signal used in 5G, and radio-frequency signal Sig2 may be a signal used in 5G.

According to this configuration, 5G carrier aggregation can be executed while reducing the power consumption of power amplifying circuit 10 when amplifying radio-frequency signal Sig2 which has a relatively wide channel bandwidth or band bandwidth.

Furthermore, radio-frequency signal Sig1 and radio-frequency signal Sig2 may be signals of WLAN.

Furthermore, when a value indicating the output power of the radio-frequency signal output from power amplifying circuit 10 is greater than a threshold power, radio-frequency signal Sig1 may be amplified in an amplification mode according to the APT method and radio-frequency signal Sig2 may be amplified in an amplification mode according to the ET method.

According to this configuration, in the high output region in which power consumption becomes high, radio-frequency signal Sig2 which has a greater channel bandwidth or band bandwidth than radio-frequency signal Sig1 is amplified in the ET mode, and thus of the power consumption of power amplifying circuit 10 when amplifying radio-frequency signal Sig2 can be effectively reduced.

Furthermore, communication device 6 includes RFIC 4 that processes a radio-frequency signal, and radio-frequency circuit 1 that receives the radio-frequency signal processed by RFIC 4.

According to this configuration, communication device 6 that reduces power consumption when amplifying radio-frequency signal Sig2 which has a relatively wide channel bandwidth can be provided.

Furthermore, RFIC 4 may include a controller that outputs a control signal for causing power amplifying circuit 10 to operate in one of the amplification mode according to the ET method and the amplification mode according to the APT method, based on information indicating which one of radio-frequency signal Sig1 and radio-frequency signal Sig2 is to be input to radio-frequency circuit 1. Communication device 6 may further include amplification mode switching circuit 3 which is disposed between the controller and power amplifying circuit 10 and switches between supplying bias signal b2 corresponding to the APT method and supplying bias signal b1 corresponding to the ET method, to power amplifying circuit 10, based on the control signal output from the controller.

According to this configuration, the power consumption of power amplifying circuit 10 can be reduced using a simplified circuit configuration.

OTHER EMBODIMENTS

Although the radio-frequency circuit and the communication device according to the present disclosure has been described above based on an exemplary embodiment and variations thereof, the radio-frequency circuit and the communication device according to the present disclosure are not limited to the foregoing embodiment and variations thereof. The present disclosure also encompasses other embodiments achieved by combining arbitrary elements in the above embodiment and variations thereof, variations resulting from various modifications to the embodiment and variations thereof that may be conceived by those skilled in the art without departing from the essence of the present disclosure, and various devices that include the radio-frequency circuit and the communication device according to the present disclosure.

Furthermore, although in the foregoing embodiment and variations thereof, the configuration for the case of transmitting two radio-frequency signals having different band bandwidths or two radio-frequency signals having different channel bandwidths is given, the configuration of the radio-frequency circuit and communication device according to the present disclosure can also be applied to the case of transmitting three radio-frequency signals having different band bandwidths or three radio-frequency signals having different channel bandwidths.

Furthermore, for example, in the radio-frequency circuit and communication device according to the foregoing embodiment and variations thereof, another radio-frequency circuit element and wiring may be inserted in a path connecting respecting circuit elements and signal paths which are disclosed in the drawings.

Furthermore, the controller according to the present disclosure may be realized as an integrated circuit (IC) or large scale integration (LSI). Furthermore, the method of implementation of structural elements using an integrated circuit may be realized using a dedicated circuit or a general-purpose processor. A field programmable gate array (FPGA) that allows for programming after the manufacture of an LSI, or a reconfigurable processor that allows for reconfiguration of the connection and the setting of circuit cells inside an LSI may be employed. When circuit integration technology that replaces LSIs comes along owing to advances of the semiconductor technology or to a separate derivative technology, the function blocks may understandably be integrated using that technology.

The present disclosure can be widely used in communication apparatuses such as a mobile phone, as a multiband/multimode-compatible front-end module.

The invention claimed is:

1. A radio-frequency circuit, comprising:
a power amplifying circuit configured to amplify a first radio-frequency signal having a first channel bandwidth and a second radio-frequency signal having a second channel bandwidth greater than the first channel bandwidth, wherein
the power amplifying circuit is configured to amplify the first radio-frequency signal in an amplifying mode according to an average power tracking method, and to amplify the second radio-frequency signal in an amplifying mode according to an envelope tracking method.

2. The radio-frequency circuit according to claim 1, wherein:
the power amplifying circuit includes a first power amplifier, and
the first power amplifier is configured to amplify the first radio-frequency signal and the second radio-frequency signal by time division.

3. The radio-frequency circuit according to claim 1, wherein:
the power amplifying circuit includes a first power amplifier and a second power amplifier,
the first power amplifier is configured to amplify one of the first radio-frequency signal or the second radio-frequency signal,
the second power amplifier is configured to amplify the other of the first radio-frequency signal or the second radio-frequency signal, and
the radio-frequency circuit is configured to simultaneously amplify the first radio-frequency signal and the second radio-frequency signal.

4. The radio-frequency circuit according to claim 3, further comprising:
a first output terminal through which a radio-frequency signal amplified by the first power amplifier is output; and
a second output terminal through which a radio-frequency signal amplified by the second power amplifier is output, wherein
the first output terminal and the second output terminal are connected to different antenna elements.

5. The radio-frequency circuit according to claim 1, wherein:
the first radio-frequency signal is used in a fourth generation mobile communication system (4G), and
the second radio-frequency signal is used in a fifth generation communication system (5G).

6. The radio-frequency circuit according to claim 5, wherein:
the first radio-frequency signal is of any one of the following long term evolution (LTE) bands: Band 28, Band 20, Band 26, Band 8, Band 3, Band 66, Band 39, Band 2, Band 1, or Band 40, and
the second radio-frequency signal is of any one of the following new radio (NR) bands: n41, n77, n78, or n79.

7. The radio-frequency circuit according to claim 1, wherein:
the first radio-frequency signal is used in a fourth generation mobile communication system (4G), and
the second radio-frequency signal is used in a wireless local area network (WLAN).

8. The radio-frequency circuit according to claim 5, wherein the second radio-frequency signal has a peak-to-average power ratio (PAPR) larger than a PAPR of the first radio-frequency signal.

9. The radio-frequency circuit according to claim 1, wherein:
the first radio-frequency signal is used in a wireless local area network (WLAN), and
the second radio-frequency signal is used in a fifth generation communication system (5G).

10. The radio-frequency circuit according to claim 1, wherein the first radio-frequency signal and the second radio-frequency signal are used in a fourth generation mobile communication system (4G).

11. The radio-frequency circuit according to claim 1, wherein the first radio-frequency signal and the second radio-frequency signal are used in a fifth generation communication system (5G).

12. The radio-frequency circuit according to claim 1, wherein the first radio-frequency signal and the second radio-frequency signal are of a wireless local area network (WLAN).

13. The radio-frequency circuit according to claim 1, wherein, when a value indicating an output power of a radio-frequency signal output from the power amplifying circuit is greater than a threshold power, the power amplifying circuit is configured to amplify the first radio-frequency signal in the amplification mode according to the average power tracking method and to amplify the second radio-frequency signal in the amplifying mode according to the envelope tracking method.

14. A communication device, comprising:
a signal processing circuit configured to process a radio-frequency signal; and
the radio-frequency circuit according to claim 1 configured to receive the radio-frequency signal processed by the signal processing circuit.

15. The communication device according to claim 14, wherein:
the signal processing circuit includes a controller configured to output a control signal for causing the power amplifying circuit to operate in one of the amplification mode according to the envelope tracking method and the amplification mode according to the average power tracking method, based on information indicating which one of the first radio-frequency signal and the second radio-frequency signal is to be input to the radio-frequency circuit, and
the communication device further comprises:
an amplification mode switching circuit disposed between the controller and the power amplifying circuit and configured to switch between supplying a first bias signal and supplying a second bias signal, to the power amplifying circuit, based on the control signal output from the controller, the first bias signal corresponding to the average power tracking method, the second bias signal corresponding to the envelope power tracking method.

16. A radio-frequency circuit, comprising:
a power amplifying circuit configured to amplify a first radio-frequency signal of a first communication band and a second radio-frequency signal of a second communication band, a bandwidth of the second communication band being wider than a bandwidth of the first communication band, wherein the power amplifying circuit is configured to amplify the first radio-frequency signal in an amplification mode according to an average power tracking method, and to amplify the second radio-frequency signal in an amplifying mode according to an envelope tracking method.

17. The radio-frequency circuit according to claim 16, wherein:
the power amplifying circuit includes a first power amplifier,
the radio-frequency circuit further comprises:
a first filter connected to an output terminal of the first power amplifier, and
the first filter has a passband that includes a frequency band of the first communication band and a frequency band of the second communication band.

18. The radio-frequency circuit according to claim 16, wherein:
the power amplifying circuit includes:
a first power amplifier configured to amplify the first radio-frequency signal; and
a second power amplifier configured to amplify the second radio-frequency signal,
the radio-frequency circuit further comprises:
a first filter connected to an output terminal of the first power amplifier and having a passband that includes a frequency band of the first communication band; and
a second filter connected to an output terminal of the second power amplifier and having a passband that includes a frequency band of the second communication band, and
the radio-frequency circuit is configured to simultaneously amplify the first radio-frequency signal and the second radio-frequency signal.

19. The radio-frequency circuit according to claim 18, further comprising:
a first output terminal through which a radio-frequency signal amplified by the first power amplifier is output;
a second output terminal through which a radio-frequency signal amplified by the second power amplifier is output, wherein
the first output terminal and the second output terminal are connected to different antenna elements.

* * * * *